United States Patent
Chae et al.

(10) Patent No.: US 7,732,318 B2
(45) Date of Patent: Jun. 8, 2010

(54) FABRICATING METHOD FOR FLAT DISPLAY DEVICE

(75) Inventors: Gee Sung Chae, Iricheon (KR); Mi Kyung Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 522 days.

(21) Appl. No.: 11/315,153

(22) Filed: Dec. 23, 2005

(65) Prior Publication Data

US 2006/0292721 A1 Dec. 28, 2006

(30) Foreign Application Priority Data

Jun. 28, 2005 (KR) ...................... 10-2005-0056553

(51) Int. Cl.
*H01L 21/00* (2006.01)

(52) U.S. Cl. ...................... 438/597; 977/777

(58) Field of Classification Search ................ 438/584, 438/597, 642, 650; 977/777
See application file for complete search history.

(56) References Cited

U.S. PATENT DOCUMENTS

| | | | | |
|---|---|---|---|---|
| 6,395,214 B1 * | 5/2002 | Kear et al. | .................. | 264/434 |
| 6,402,985 B1 * | 6/2002 | Hsu et al. | ............. | 252/301.4 R |
| 6,562,495 B2 * | 5/2003 | Yadav et al. | .................. | 429/12 |
| 6,689,190 B2 * | 2/2004 | Pozarnsky | .................... | 75/332 |
| 6,957,608 B1 * | 10/2005 | Hubert et al. | ................ | 101/483 |
| 7,005,389 B2 * | 2/2006 | Ko et al. | ...................... | 438/758 |
| 7,091,136 B2 * | 8/2006 | Basol | ........................ | 438/765 |
| 7,259,100 B2 * | 8/2007 | Zurcher et al. | .............. | 438/700 |
| 2003/0075018 A1 * | 4/2003 | Meinhardt et al. | ............ | 75/255 |
| 2004/0151893 A1 * | 8/2004 | Kydd et al. | .................. | 428/323 |
| 2005/0064618 A1 * | 3/2005 | Brown et al. | .................. | 438/49 |
| 2005/0238804 A1 * | 10/2005 | Garbar et al. | ............... | 427/180 |
| 2006/0210705 A1 * | 9/2006 | Itoh et al. | .................. | 427/96.1 |
| 2006/0286699 A1 * | 12/2006 | Chae et al. | .................... | 438/30 |

* cited by examiner

*Primary Examiner*—Savitri Mulpuri
(74) *Attorney, Agent, or Firm*—McKenna Long & Aldridge LLP

(57) ABSTRACT

A fabricating method of a flat panel display device can reduce manufacturing costs of the flat panel display device. A fabricating method of a flat panel display device includes providing a conductive nanopowder thin film material having a first conductive nanopowder and a second conductive nanopowder, spreading the conductive nanopowder thin film material over a substrate, forming a conductive thin film pattern by patterning the conductive nanopowder thin film material, and forming a conductive thin film by baking the conductive thin film pattern, wherein the first conductive nanopowder is located in a middle of the conductive thin film and the second conductive nanopowder is located in an outer part of the conductive thin film.

1 Claim, 18 Drawing Sheets

FIG.8

| Element | Symbol | SPECIFIC GRAVITY |
|---|---|---|
| LITHIUM | Li | 0.53 |
| MAGNESIUM | Mg | 1.74 |
| ALUMINUM | Al | 2.70 |
| IRON | Fe | 7.87 |
| COPPER | Cu | 8.90 |
| NICKEL | Ni | 8.90 |
| CHROMIUM | Cr | 7.19 |
| MERCURY | Hg | 13.5 |
| ZINC | Zn | 7.13 |
| TIN | Sn | 7.28 |
| LEAD | Pb | 11.34 |
| OSMIUM | Os | 22.5 |

US 7,732,318 B2

FABRICATING METHOD FOR FLAT DISPLAY DEVICE

This application claims the benefit of Korean Patent Application No. 10-2005-0056553, filed on Jun. 28, 2005, which is hereby incorporated by reference for all purposes as if fully set forth herein.

BACKGROUND OF THE INVENTION

1. Field of the Invention

The present invention relates to a fabricating method of a flat panel display device. More particularly, the present invention relates to a fabricating method of a flat panel display device that can reduce manufacturing costs of the flat panel display device.

2. Description of the Related Art

Generally, a liquid crystal display (LCD) device controls light transmitting through liquid crystal according to a video signal to display a picture. The liquid crystal display device may include a liquid crystal display panel, where liquid crystal cells are arranged in a matrix, and a drive circuit that drives the liquid crystal display panel.

Liquid crystal display devices may be classified according to an electric field direction in which liquid crystal is driven. For a liquid crystal display device having a twisted nematic (TN) mode, a vertical direction electric field is used. For a liquid crystal display device having an in-plane switch (IPS) mode, a horizontal direction electric field is used.

The TN mode drives liquid crystal by a vertical electric field between a pixel electrode and a common electrode of an upper substrate. The pixel electrode and the common electrode are disposed to face each other. The TN mode has an advantage in that its aperture ratio is high, but has a disadvantage in that its viewing angel is narrow. On the other hand, the IPS mode drives liquid crystal by a horizontal electric field between a pixel electrode and a common electrode. The pixel electrode and the common electrode are arranged parallel to each other on a lower substrate. The IPS mode has an advantage in that its viewing angle is wide, but has a disadvantage in that its aperture ratio is low.

FIG. 1 is a cross sectional view representing a TN mode liquid crystal display panel of the related art.

Referring to FIG. 1, the liquid crystal display panel includes an upper array substrate 52, a lower array substrate 82 and a liquid crystal 16 injected into an inner space between the upper array substrate 52 and the lower array substrate 82. For the upper array substrate 52, a black matrix 54, a color filter 56, a common electrode 68 and an upper alignment film 58 are sequentially formed. For the lower array substrate 82, a TFT, a pixel electrode 66 and a lower alignment film 88 are formed.

In the upper array substrate 52, the black matrix 54 defines a cell area where the color filter 56 may be formed. The black matrix 54 also prevents light leakage and absorbs external light so as to increase contrast. The color filter 56 may be formed in the cell area that is divided by the black matrix 54. The color filter 56 is formed of R (red), G (green) and B (blue) elements, so as to realize a color picture of the liquid crystal display panel. A common voltage is supplied to the common electrode 68 for controlling the movement of the liquid crystal 16. In an IPS mode, where the horizontal direction electric field is used, the common electrode 68 is formed on the lower array substrate 82. On the other hand, in a TN mode, where the vertical direction electric field is used, the common electrode 68 is formed on the upper substrate 52.

In the lower array substrate 82, the TFT includes a gate electrode 59 and a gate line (not shown) formed. A semiconductor layer, including layers 64 and 97, overlaps the gate electrode 59. A gate insulating film 94 is formed therebetween. Source/drain electrode 90, 92 are formed together with a data line (not shown). The semiconductor layer, including layers 64 and 97, is formed therebetween. The TFT supplies a pixel signal from the data line to the pixel electrode 66 in response to a scan signal from the gate line.

The pixel electrode 66 may be formed of a transparent conductive material with a high light transmittance and is in contact with a drain electrode 92 of the TFT. A passivation film 100 is formed therebetween. Upper/lower alignment films 58, 88 that align liquid crystal are formed by performing a rubbing process after spreading an alignment material, such as polyimide.

Thin film patterns, including the gate electrode 59 of the liquid crystal display panel, are typically patterned by a photolithography process using a mask.

FIGS. 2A to 2D are cross sectional views representing a step-by-step formation of a gate electrode by using a photolithography process.

Referring to FIG. 2A, a gate metal 59a and a photo-resist 60 are deposited on the lower substrate 82 by a deposition method such as sputtering. A mask 61 having an aperture part is aligned at each area where the gate electrode 59 is to be formed in an upper part thereof. An exposure process and a development process are performed to form a photo-resist pattern 60a shown in FIG. 2B. An etching process is performed to pattern the gate electrode 59 as shown in FIG. 2C. The gate electrode 59 is completed by the stripping process as shown in FIG. 2D.

However, a photolithography process using a mask includes steps of photo-resist depositing, mask aligning, exposing and developing processes, and an etching process. Thus, the process is complicated. Also, a developing solution that develops the photo-resist and the photo-resist pattern is excessively wasted. Furthermore, expensive equipment is used in the exposure process of the photolithography process.

SUMMARY OF THE INVENTION

Accordingly, the present invention is directed to a fabricating method for a flat display device that substantially obviates one or more of the problems due to limitations and disadvantages of the related art.

An advantage of the present invention is to provide a fabricating method for a flat display device that can reduce manufacturing costs of the flat panel display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabricating method of a flat panel display device includes providing a conductive nanopowder thin film material, by dissolving a first conductive nanopowder having a first oxidation enthalpy and a second conductive nanopowder having a second oxidation enthalpy higher than the first oxidation enthalpy in a solvent, spreading the conductive nanopowder thin film material over a substrate, forming a conductive thin film pattern by patterning the conductive nanopowder thin film material, and forming a conductive thin film by baking the conductive thin film pattern, wherein the first conductive nanopowder is located in a middle of the conductive thin film and the second conductive nanopowder is located in an outer part of the conductive thin film.

In another aspect of the present invention, a fabricating method of a flat panel display device includes providing a conductive nanopowder thin film material having a first conductive nanopowder and a second conductive nanopowder, spreading the conductive nanopowder thin film material over a substrate, forming a conductive thin film pattern by patterning the conductive nanopowder thin film material, and forming a conductive thin film by baking the conductive thin film pattern.

In another aspect of the present invention, a fabricating method of a flat panel display device includes providing a conductive nanopowder thin film material having a first conductive nanopowder and a second conductive nanopowder, spreading the conductive nanopowder thin film material over a substrate, forming a conductive thin film pattern by patterning the conductive nanopowder thin film material, and forming a conductive thin film by baking the conductive thin film pattern, wherein the first conductive nanopowder is located in a middle of the conductive thin film and the second conductive nanopowder is located in an outer part of the conductive thin film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 8 is a diagram representing a specific gravity of a number of conductive nanopowders.

DETAILED DESCRIPTION OF THE ILLUSTRATED EMBODIMENTS

Reference will now be made in detail to exemplary embodiments of the present invention, examples of which are illustrated in the accompanying drawings.

With reference to FIGS. 3A to 8, exemplary embodiments of the present invention will be explained as follows.

FIGS. 3A to 3D are diagrams representing a step-by-step formation of a gate electrode according to an exemplary embodiment of the present invention.

Figure 1:
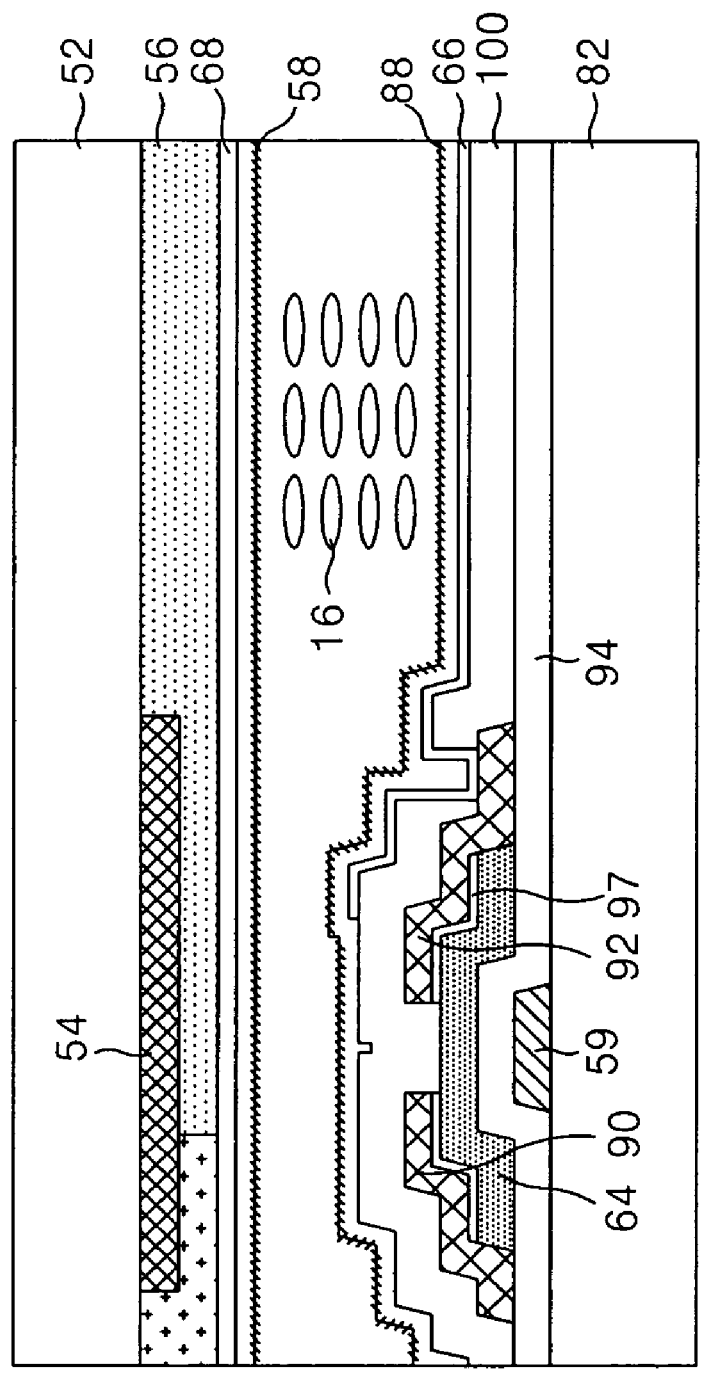
FIG. 1 is a cross sectional view representing a liquid crystal display panel of the related art.
Figure 2A:
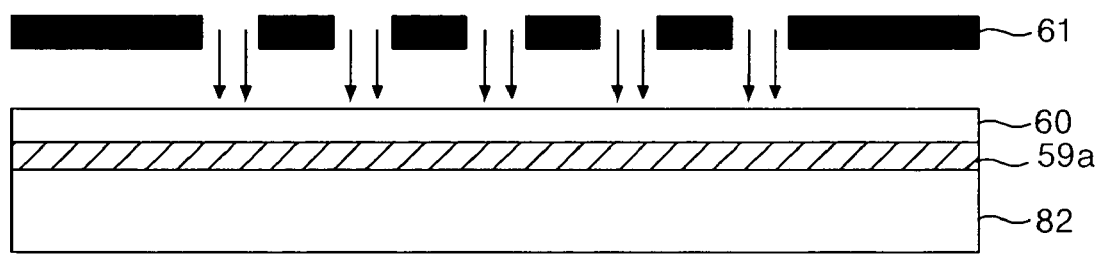
FIGS. 2A to 2D are cross sectional views representing a step-by-step formation of a gate electrode by using a photolithography process.
Figure 2B:
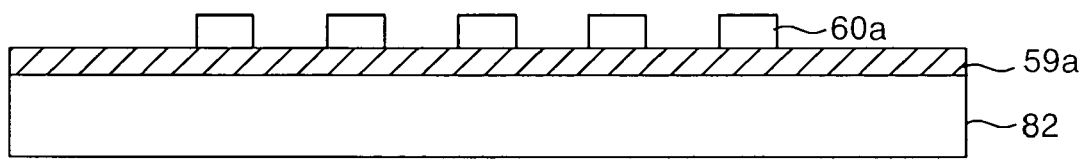
Figure 2C:
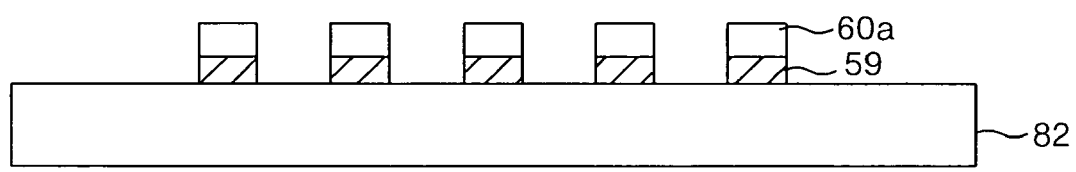
Figure 2D:
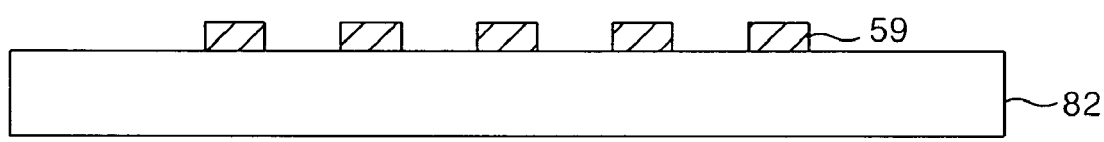
Figure 3A:
FIGS. 3A to 3D are cross sectional views representing a step-by-step formation of a gate electrode according to an exemplary embodiment of the present invention.

Referring to FIG. 3A, a nanopowder gate electrode material 159a is spread over an entire surface of a lower substrate 182. The nanopowder gate electrode material 159a may be a gate electrode material such as aluminum (Al), copper (Cu), chrome (Cr), molybdenum (Mo), aluminum/neodymium (Al/Nd), etc., or any alloy thereof. The nanopowder gate electrode material 159a may be resolved to a nano (nm) size. The nanopowder gate electrode material 159a may be dissolved in a solvent.

Figure 3B:
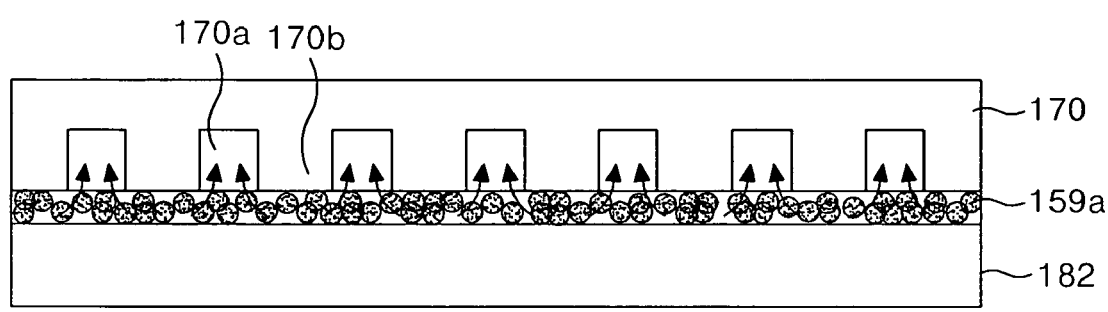

Referring to FIG. 3B, a soft mold 170 is aligned with the nanopowder gate electrode material 159a. The soft mold 170 has projected parts 170b. The projected parts 170b are formed in areas corresponding to areas where gate electrodes are formed on the lower substrate 182, where the nanopowder gate electrode material 159a is spread over an entire surface thereof. The soft mold 170 also has grooves 170a in areas elsewhere. The soft mold 170 contacts the nanopowder gate electrode material 159a, which is spread over the lower substrate 182.

The soft mold 170 may be a soft mold as disclosed in Korean Patent Application No. 10-2003-0098122 that was previously applied for by the applicant of the present invention. The soft mold 170 may be made of a rubber material with high elasticity, such as, polydimethylsiloxane (PDMS), polyurethane, cross-linked novolac resin, etc.

Figure 3C:
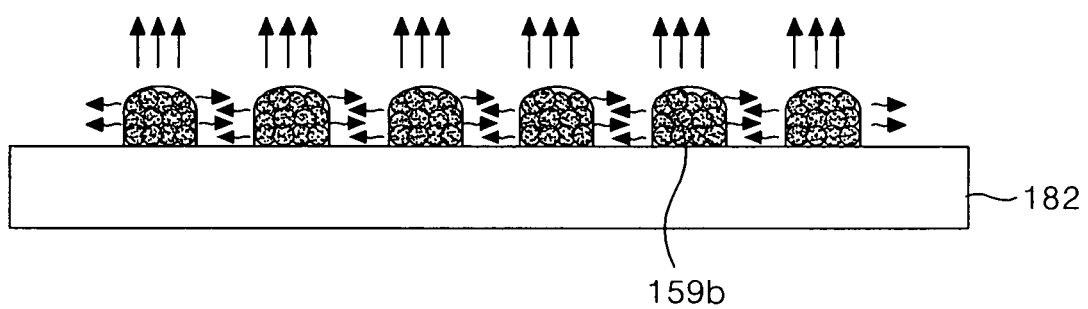

The surface of the projected parts 170b of the soft mold 170 contacts the nanopowder gate electrode material 159a and applies pressure thereto. The pressure is due to the weight of the soft mold 170 for a designated time, such as about 30 seconds to 10 minutes, so as to cause the surface of the projected part 170b of the soft mold 170 to contact the lower substrate 182. Simultaneously, the nanopowder gate electrode material 159a is soft-cured by ultraviolet rays, etc., or the lower substrate 182 is baked at a temperature of about 130° C. or less. Then, the nanopowder gate electrode material 159a moves into the groove 170a of the soft mold 170 by a capillary force, generated by a pressure between the soft mold 170 and the lower substrate 182, and a repulsive force, generated between the soft mold 170 and the nanopowder gate electrode material 159a. Accordingly, the nanopowder gate electrode pattern 159b is formed in an area corresponding to the groove 170a of the soft mold 170, as shown in FIG. 3C.

Figure 3D:
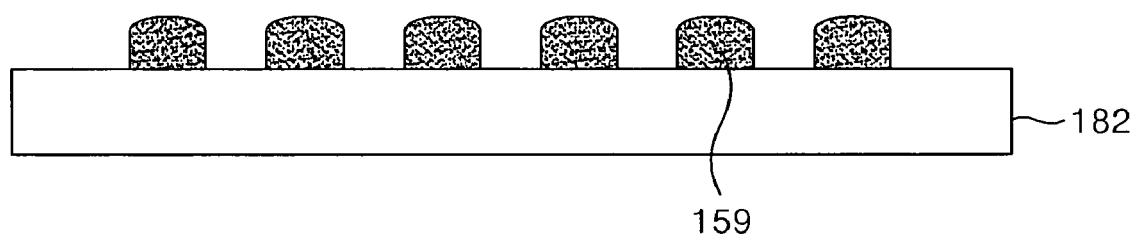

Then, a heat treatment, such as a baking process, vaporizes the solvent included in the nanopowder gate electrode pattern 159b. A current path is formed between nanoparticles of the nanopowder gate electrode pattern 159b at the same time as the vaporization of the solvent, thereby forming the gate electrode 159, as shown in FIG. 3D.

If thin film patterns are formed using the soft mold 170 and the dissolved nanopowder gate electrode material 159a, etc., it is possible to omit an exposing process, a developing process, and an etching process that are required in forming thin film patterns using photolithography of the related art. Accordingly, a fabricating process of a flat panel display device may be simplified. Also, it is possible to reduce the amount developing solution wasted in developing a photo-resist and a photo-resist pattern. In addition, expensive exposure equipment is not required. Thus, it is possible to reduce manufacturing costs of the liquid crystal display panel.

In an exemplary embodiment, each conductive nanopowder, among the nanopowders for forming thin film patterns of the present invention, has a unique oxidation enthalpy. As a result, the extent of which a current path may be formed for each conductive nanopowder differs according to the oxidation enthalpy of each conductive nanopowder used when forming a current path between the conductive nanoparticles. Further, the conductive nanopowder does not oxidize as easily when the unique oxidation enthalpy of the conductive nanopowder increases.

The oxidation enthalpy of each conductive nanopowder, and the extent of which a current path may be formed for each conductive nanopowder according to the unique oxidation enthalpy of each conductive nanopowder, are explained as follows with reference to FIGS. 4 and 5.

Figure 4:
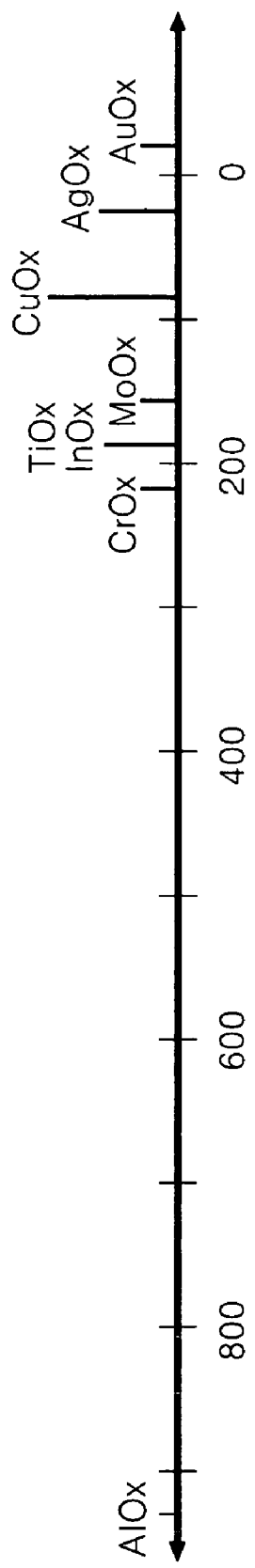
FIG. 4 is a diagram representing an oxidation enthalpy of a number of conductive nanopowders.

FIG. 4 is a diagram representing an enthalpy of a number of conductive nanopowders.

Referring to FIG. 4, oxidation enthalpies of a number of conductive nanopowders, except an aluminum (Al) nanopowder, are 300 Kcal/mol or less.

Figure 5:
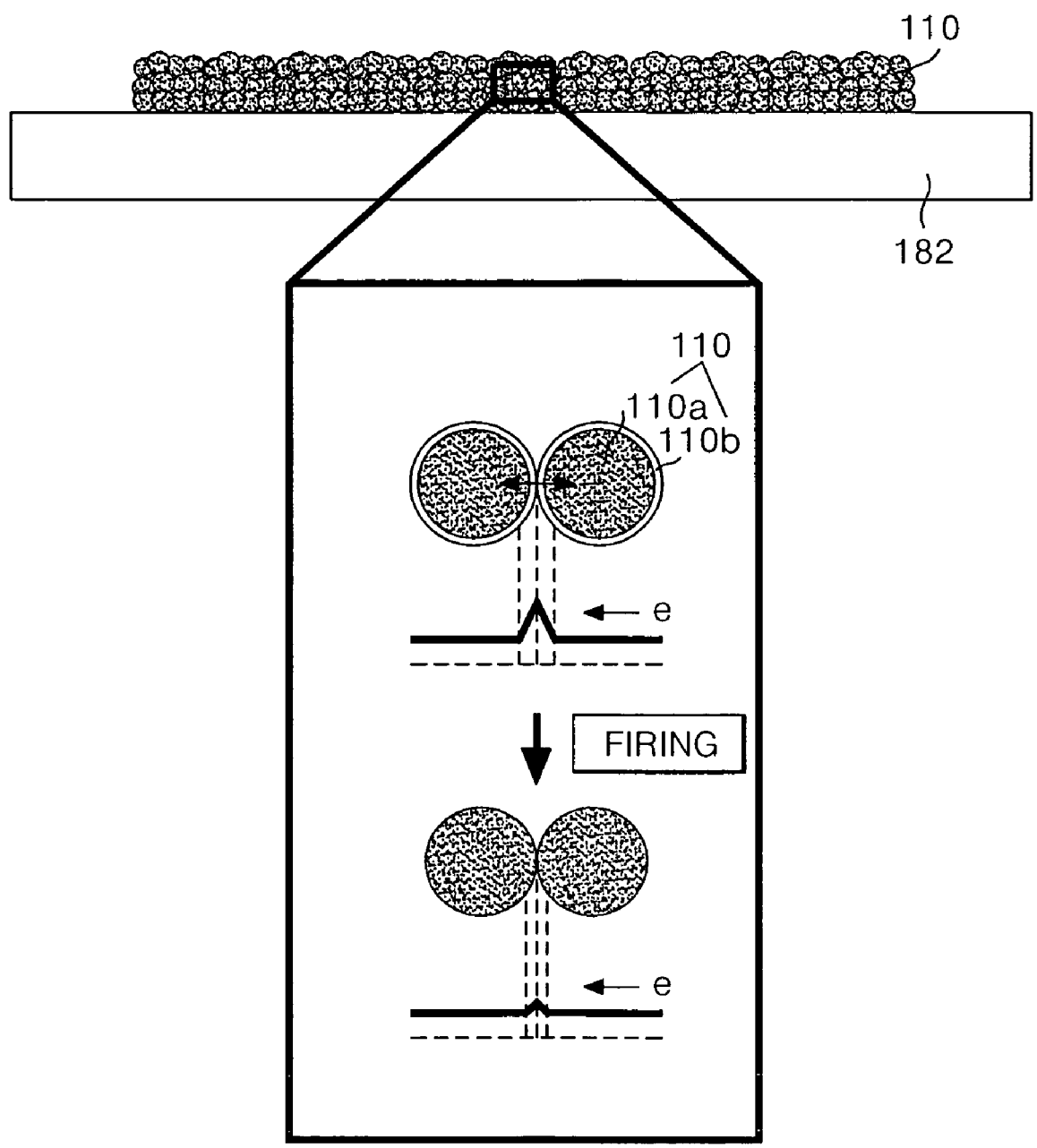
FIG. 5 is a diagram representing an extent of forming a current path of each conductive nanopowder according to the unique oxidation enthalpy of each conductive nanopowder.

FIG. 5 is a diagram representing forming a current path between copper (Cu) nanoparticles according to oxidation enthalpies of the copper (Cu) nanoparticles. As an example, a copper (Cu) nanopowder, among the conductive nanopowders, is shown as an example. The copper (Cu) nanopowder has an ordinary oxidation enthalpy, among the conductive nanopowders shown in FIG. 4.

Referring to FIG. 5, each of the copper (Cu) nanoparticles 110 is composed of a conductive material 110*a* and an oxidation film 110*b* encompassing the internal conductive material 110*a*. The internal conductive material 110*a* of each of the copper (Cu) nanoparticles 110 is protected from an external chemical attack by the oxidation film 110*b* that encompasses the outside of the internal conductive material 110*a*. However, the oxidation film 110*b* interferes with forming the current path between the internal conductive materials 110*a*.

Due to this reason, a process of removing the oxidation film 110*b* by a heat-treatment, such as a baking process, may be required in forming the electrode thin film pattern by use of the conductive nanopowder. Thus, the current path between the internal conductive materials 110*a* is formed by a process of removing the oxidation film 110*b* that encompasses the internal conductive material 110*a* of the copper (Cu) nanoparticles 110.

In the current path between the conductive nanoparticles formed by such a baking process, the current path between internal conductive materials of the conductive nanoparticles may not be easily formed because it is difficult to remove the oxidation film when the conductive nanopowder has a high oxidation enthalpy.

On the other hand, if the conductive nanopowder has a low oxidation enthalpy value, it is easy to form a current path between the conductive nanoparticles. However, the conductive nanopowder is weak and is vulnerable to external chemical attack because of its low oxidation enthalpy value. Thus, a disadvantage exists in that the conductive nanopowder is easily oxidized from the external chemical attack.

Accordingly, the fabricating method of the flat panel display device according to an exemplary embodiment of the present invention may form an electrode where the extent of which the current path is formed between the conductive nanoparticles is excellent when forming the electrode using conductive nanopowder and may form an electrode which is strong to external chemical attack.

Figure 6:
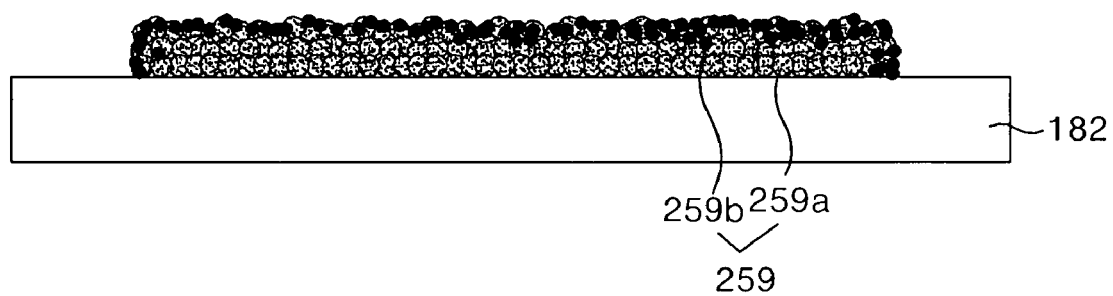
FIG. 6 is a diagram representing an example of a gate electrode formed by use of a nanopowder gate electrode material according to an exemplary embodiment of the present invention.

FIG. 6 is a diagram representing an example of a gate electrode formed by use of a nanopowder gate electrode material according to an exemplary embodiment of the present invention.

Referring to FIG. 6, a gate electrode 259 according to an exemplary embodiment of the present invention is formed from a mixture of a copper (Cu) nanoparticles 259*b* and a silver (Ag) nanoparticles 259*a*. The copper (Cu) nanoparticles 259*b* are formed to have a relatively low mass compared to that of the silver (Ag) nanoparticles 259*a*. The silver (Ag) nanoparticles 259*a* are formed to have a relatively high mass compared to that of the copper (Cu) nanoparticles 259*b*.

As a result, the gate electrode 259 according to an exemplary embodiment of the present invention has the silver (Ag) nanoparticles 259*a*, which have the relatively high mass, located within the gate electrode 259, and the copper (Cu) nanoparticles 259*b*, which have the relatively low mass, located at the outside of the gate electrode 259. Thus, the gate electrode 259 enables the formation of the current path to be improved due to the silver (Ag) nanoparticles 259*b* having a low oxidation enthalpy located within the gate electrode 259, and is strong from external chemical attack due to the copper (Cu) nanoparticles 259*b* having a high oxidation enthalpy located at the outside of the gate electrode 259.

The silver (Ag) nanoparticles 259*a* with the low oxidation enthalpy are formed to have higher mass than the copper (Cu) nanoparticles 259*b*, so as to be formed within the gate electrode 259 to improve the formation of the current path within the gate electrode 259. The copper (Cu) nanoparticles 259*b* with the high oxidation enthalpy are formed to have lower mass than the silver (Ag) nanoparticles 259*a*, so as to be formed on the outside the gate electrode 259 to protect the gate electrode 259 from external chemical attack.

The gate electrode 259 according to an exemplary embodiment of the present invention increases the mass of the conductive nanoparticles with the low oxidation enthalpy within the gate electrode 259 to improve the extent of forming the current path between the internal conductive nanoparticles of the gate electrode 259, and decreases the mass of the conductive nanoparticles with the high oxidation enthalpy in the outside of the gate electrode 259, thereby enabling the gate electrode 259 to have a strong characteristic against chemical attack from the outside.

The formation of the gate electrode according to an exemplary embodiment of the present invention is explained as follows with reference to FIGS. 7A to 7E.

Figure 7A:
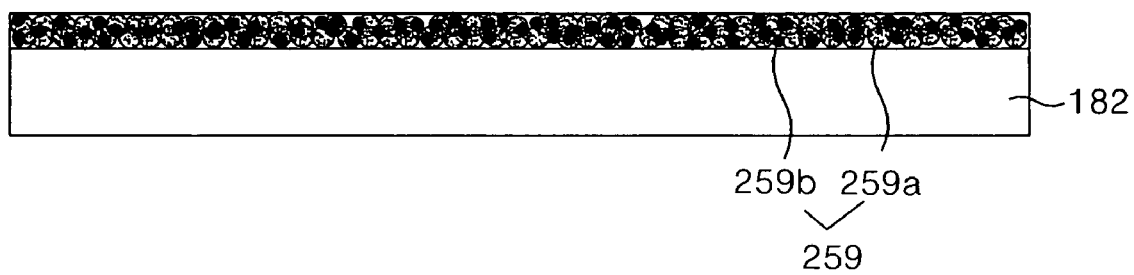
FIGS. 7A to 7E are diagrams representing a step-by-step formation of a gate electrode by use of a conductive nanopowder according to an exemplary embodiment of the present invention.

Referring to FIG. 7A, in the formation of the gate electrode according to the present invention, the nanopowder gate electrode material is spread over the entire surface of the lower substrate 182. The nanopowder gate electrode material includes conductive nanopowders having two or more oxidation enthalpies that are different from each other and that are mixed and dissolved in a solvent. The conductive nanoparticles 259*b* with the high oxidation enthalpy are formed to have a low mass, and the conductive nanoparticles 259*a* with the low oxidation enthalpy among the conductive nanopowders are formed to have a high mass.

Figure 7B:
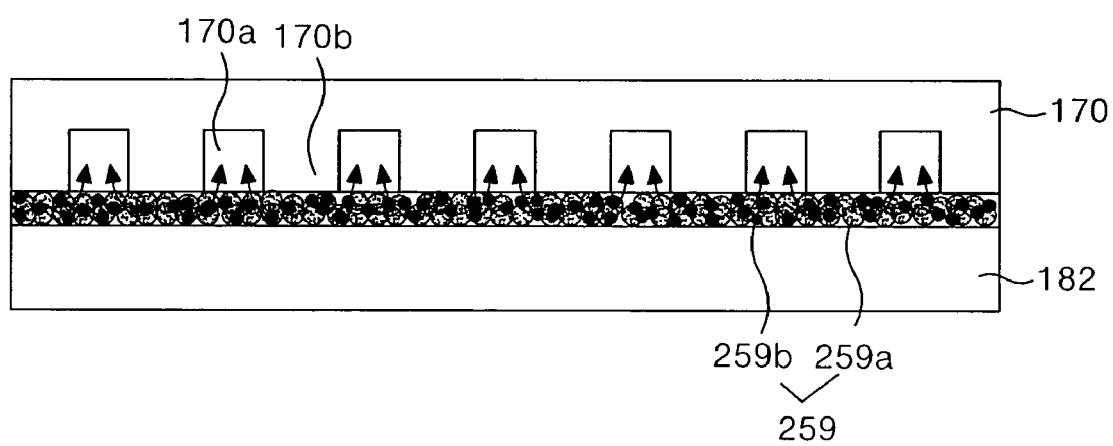
Figure 7C:
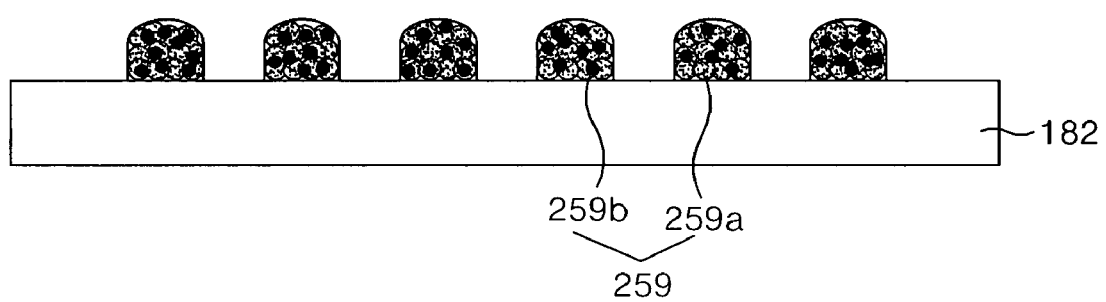

Referring to FIG. 7B, a soft mold 170 having a groove 170*a* is aligned with the nanopowder gate electrode material. Groove 170*a* are formed in areas corresponding to areas where gate electrodes are formed on the lower substrate 182, where the nanopowder gate electrode material is spread over an entire surface thereof. The soft mold 170 has projected parts 170*b* in areas elsewhere. The soft mold 170 contacts the nanopowder gate electrode material that is spread over the lower substrate 182.

The surface of projected parts 170*b* of the soft mold 170 contacts the nanopowder gate electrode material and applies pressure thereto. The pressure is due to the weight of the soft mold 170 for a designated time, such as about 30 seconds to 10 minutes, so as to cause the surface of the projected part 170*b* of the soft mold 170 to contact the lower substrate 182. Simultaneously, the nanopowder gate electrode material is soft-cured by ultraviolet rays, etc., or the lower substrate 182 is baked at a temperature of about 130° C. or less. Then, the nanopowder gate electrode material moves into the groove 170a of the soft mold 170 by a capillary force, generated by a pressure between the soft mold 170 and the lower substrate 182, and a repulsive force, generated between the soft mold 170 and the nanopowder gate electrode material. Accordingly, the nanopowder gate electrode pattern is formed in an area corresponding to the groove 170a of the soft mold 270, as shown in FIG. 3C.

Figure 7D:
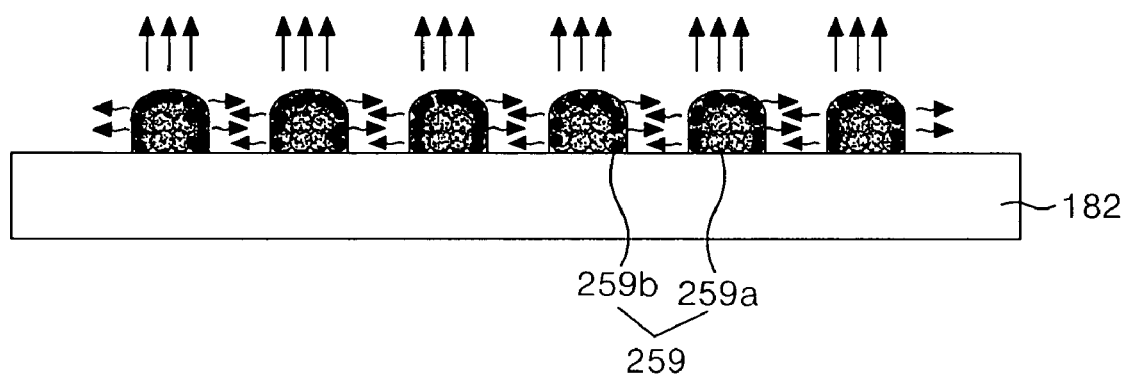

Then, a heat treatment, such as a baking process, vaporizes the solvent included in the nanopowder gate electrode pattern. The nanoparticles 259b with the high oxidation enthalpy, as shown in FIG. 7D, are located at an outer area of the gate electrode 259 because they moves to the outer area of the gate electrode 259 by a vaporization force generated when the solvent is vaporized. Further, the nanoparticles 259a with the low oxidation enthalpy, i.e., with a high mass remain within the gate electrode 259.

Figure 7E:
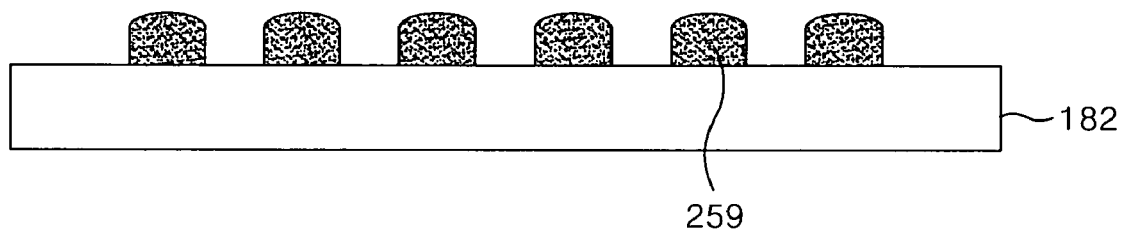

When the solvent is vaporized, the gate electrode 259 is completed. In the completed gate electrode 259, as shown in FIG. 7E, the nanoparticles 259b with the high oxidation enthalpy, i.e., with the low mass are located at the outer area of the gate electrode 259, and the nanoparticles 259a with the low oxidation enthalpy, i.e., with the high mass are located within the gate electrode 259.

Accordingly, the gate electrode 259 according to an exemplary embodiment of the present invention has a strong resistance against chemical attack from the outside due to the nanoparticles 259b having a high oxidation enthalpy that are located at the outside of the gate electrode 259. Also, the current path is improved by the nanoparticles 259a having a low oxidation enthalpy that are located within the gate electrode 259.

FIG. 8 is a diagram representing the specific gravity of a number of conductive nanopowders.

In reference to FIGS. 4 and 8, an exemplary embodiment of forming a gate electrode by using a nanopowder gate electrode material where chrome (Cr) and copper (Cu) are mixed will be explained as follows.

Chrome (Cr) should be located in the outer area of the gate electrode that is to be formed because the oxidation enthalpy of chrome (Cr) is higher than that of copper (Cu). Copper (Cu) should be located within the gate electrode that is to be formed because the oxidation enthalpy of copper (Cu) is lower than that of chrome (Cr).

However, if the conductive nanoparticles s are formed such that chrome (Cr) nanoparticles have the same volume as copper (Cu) nanoparticles, a specific gravity of chrome (Cr) is higher than that of copper (Cu). Thus, there is a problem in that the copper (Cu) nanoparticles, with the low specific gravity, move to the outer area of the gate electrode when the solvent is vaporized.

In order to prevent such a problem, in the formation of the nanopowder gate electrode material according to an exemplary embodiment of the present invention, the two or more conductive nanopowders that are to be mixed are predetermined. Each conductive nanopowder is formed in consideration of the oxidation enthalpy of each conductive nanopowder, so that the mass of the conductive nanoparticles with the low oxidation enthalpy is made to be higher than the mass of the conductive nanoparticles with the high oxidation enthalpy.

Thus, in using chrome (Cr) and copper (Cu), the oxidation enthalpy of chrome (Cr) is higher than the oxidation enthalpy of copper (Cu). Thus, the foregoing effect is obtained by decreasing the volume of chrome (Cr) nanoparticles or by increasing the volume of copper (Cu) nanoparticles in order to move chrome (Cr) to the outer area of the gate electrode, which is to be formed, at the same time as the evaporation of the solvent.

As described above, the fabricating method of the flat panel display device according to exemplary embodiments of the present invention, includes forming thin film patterns using a soft mold and a dissolved nanopowder gate electrode material, etc. Thus, it is possible to omit an exposing process, a developing process, and an etching process, which are required in forming thin film patterns using photolithography of the related art. Accordingly, a fabricating process of a flat panel display device can be simplified. Also, it is possible to reduce the amount of developing solution wasted when developing a photo-resist and a photo-resist pattern. In addition, expensive exposure equipment is not required. Thus, it is possible to reduce manufacturing costs of the liquid crystal display panel.

Further, the gate electrode according to exemplary embodiments of the present invention has a strong resistance against chemical attack from the outside due to the nanopowder with the high oxidation enthalpy, i.e., with the low mass nanoparticles, located in the outside of the gate electrode. Also, a current path is improved due to the nanopowder with the low oxidation enthalpy, i.e., with the high mass nanoparticles, located in the inside of the gate electrode. Also, the current path is improved by locating the nanopowder that has the high oxidation enthalpy and the low mass nanoparticles at the outside of the gate electrode and locating the nanopowder that has the low oxidation enthalpy and the high mass nanoparticles at the inside of the gate electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a flat panel display device, comprising:

providing a conductive nanopowder thin film material, by dissolving a first conductive nanopowder including first conductive nanoparticles which have a first oxidation enthalpy and a second conductive nanopowder including second conductive nanoparticles which have a second oxidation enthalpy higher than the first oxidation enthalpy in a solvent, wherein the first conductive nanoparticles are higher in mass or volume than the second conductive nanoparticles, and wherein the second conductive nanopowder has stronger oxidation characteristics than the first conductive nanopowder, and wherein the first conductive nanopowder has a better conductivity than the second conductive nanopowder;

spreading the conductive nanopowder thin film material over a substrate;

forming a conductive thin film pattern by patterning the conductive nanopowder thin film material, including:
aligning a soft mold, wherein the soft mold has a groove in an area where the conductive thin film pattern is to be formed on the substrate over which the conductive nanopowder thin film material is spread and wherein the soft mold has a projected part in other areas; and applying pressure to the soft mold such that the soft mold is in contact with the substrate, thereby causing the projected part of the soft mold to contact the substrate; and forming a conductive thin film by baking the conductive thin film pattern, including vaporizing the solvent where the first conductive nanoparticles and the second conductive nanoparticles are dissolved, wherein the second conductive nanoparticles move to an outer part of the conductive thin film by a force that occurs as the solvent is vaporized, wherein the first conductive nanopowder is located at a middle of the conductive thin film and the second conductive nanopowder is located in the outer part of the conductive thin film after forming the conductive thin film, and wherein the first conductive nanopowder includes at least one of silver or copper and the second conductive nanopowder includes at least one of copper or chromium, and wherein the first conductive nanopowder includes a different element than the second conductive nanopowder.

* * * * *